(12) United States Patent
Hsu et al.

(10) Patent No.: US 11,069,668 B2
(45) Date of Patent: Jul. 20, 2021

(54) ELECTRONIC DEVICE FOR REDUCING A BORDER EDGE OF THE NON-DISPLAY AREAS

(71) Applicant: InnoLux Corporation, Miao-Li County (TW)

(72) Inventors: Yi-Hua Hsu, Miao-Li County (TW); Ming-Chun Tseng, Miao-Li County (TW); Shu-Wei Hsu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/526,938

(22) Filed: Jul. 30, 2019

(65) Prior Publication Data

US 2020/0083203 A1 Mar. 12, 2020

Related U.S. Application Data

(60) Provisional application No. 62/728,863, filed on Sep. 9, 2018.

(30) Foreign Application Priority Data

Mar. 28, 2019 (CN) .......................... 201910241685.1

(51) Int. Cl.
*H01L 25/16* (2006.01)
(52) U.S. Cl.
CPC ................................. *H01L 25/167* (2013.01)
(58) Field of Classification Search
CPC ..................................................... H01L 25/167
USPC .......................................................... 257/88
See application file for complete search history.

(56) References Cited

U.S. PATENT DOCUMENTS

| 2008/0018583 | A1 | 1/2008 | Knapp et al. |
| 2014/0145171 | A1 | 5/2014 | Park et al. |
| 2016/0358534 | A1 | 12/2016 | Kim |
| 2016/0358575 | A1* | 12/2016 | Kobayashi ............. G11C 19/28 |
| 2017/0110091 | A1 | 4/2017 | Huang et al. |

FOREIGN PATENT DOCUMENTS

CN 108109569 A 6/2018

OTHER PUBLICATIONS

European Search Report dated Jan. 15, 2020, issued in application EP19194121.0.
Chinese language office action dated Mar. 1, 2021, issued in application No. CN 201910241685.1.
European Oral Proceedings dated Mar. 23, 2021, issued in application No. EP 19194121.0.

* cited by examiner

*Primary Examiner* — Ajay Arora
(74) *Attorney, Agent, or Firm* — McClure, Qualey & Rodack, LLP

(57) ABSTRACT

An electronic device is provided. The electronic device includes a first signal line and a second signal line. The first signal line is arranged in the electronic device, and the first signal line at least includes a first section. The second signal line is arranged adjacent to the first signal line, and the second signal line at least includes a second section. An extension direction of the first section is different than an extension direction of the second section. From the top view of the electronic device, the second section is crossed with the first section.

16 Claims, 9 Drawing Sheets

ELECTRONIC DEVICE FOR REDUCING A BORDER EDGE OF THE NON-DISPLAY AREAS

CROSS REFERENCE TO RELATED APPLICATIONS

This Application claims benefit of U.S. Provisional Application No. 62/728,863, filed on Sep. 9, 2018, and China Patent Application No. 201910241685.1, filed on Mar. 28, 2019, the entirety of which are incorporated by reference herein.

FIELD OF THE PRESENT DISCLOSURE

The present disclosure relates to a signal line configuration technique, and in particular to the signal line configuration technique of an electronic device.

DESCRIPTION OF THE RELATED ART

With the development of technology, the application of electronic devices has become more and more extensive. In recent years, when an electronic device is applied to a spliced electronic device, in order to reduce the frame window generated by the splicing of two adjacent electronic devices, the space of each electronic device on the splicing side will be limited. Therefore, how to properly align the electronic components and signal lines (data lines and/or scan lines) of each electronic device on the side will be discussed.

BRIEF SUMMARY OF THE PRESENT DISCLOSURE

In view of the problem described above, the present disclosure provides a signal line configuration technique of an electronics device.

The present disclosure discloses an electronic device including a first signal line and a second signal line. The first signal line is arranged in the electronic device, and at least includes a first section. The second signal line is arranged adjacent to the first signal line, and at least includes a second section. The first extension direction of the first section is different from the second extension direction of the second section. From a top view of the electronic device, the second section is crossed with the first section.

DETAILED DESCRIPTION OF THE PRESENT DISCLOSURE

The present disclosure can be more fully understood by reading the subsequent detailed description with references made to the accompanying figures.

It should be understood that the figures are not drawn to scale in accordance with standard practice in the industry. In fact, it is allowed to arbitrarily enlarge or reduce the size of devices for clear illustration.

Hereinafter, the term "about" generally means within 20%, preferably within 10%, and more preferably within 5% of a given value or range. The quantity given herein is an approximate number, meaning that the meaning of "about" may be implied without a specific description.

In some embodiments of the disclosure, relative terms such as "lower", "upper", "horizontal", "vertical", "below", "above", etc., are to be understood as the orientations depicted in the paragraph and related schemas. This relative term is used for convenience of description, and does not mean that the device described therein is to be manufactured or operated in a particular orientation. Terms such as "connect", "couple", and "interconnect", etc., unless otherwise defined, may mean that two structures are in direct contact, or that two structures are not in direct contact (indirect contact), and other structures are provided between the two structures. The terms "connect" and "couple" may also include the case where both structures are movable or both structures are fixed.

In particular, the term "signal line" used in embodiments of the present disclosure may indicate different types of signal lines, such as data lines, scan lines, power supply voltage (VDD) lines, shared signal lines (Vcom), etc., but it is not limited thereto. In addition, a data line or a scan line are examples of a "signal line" in the embodiment of the present disclosure, but the disclosure is not limited thereto.

Figure 1A:
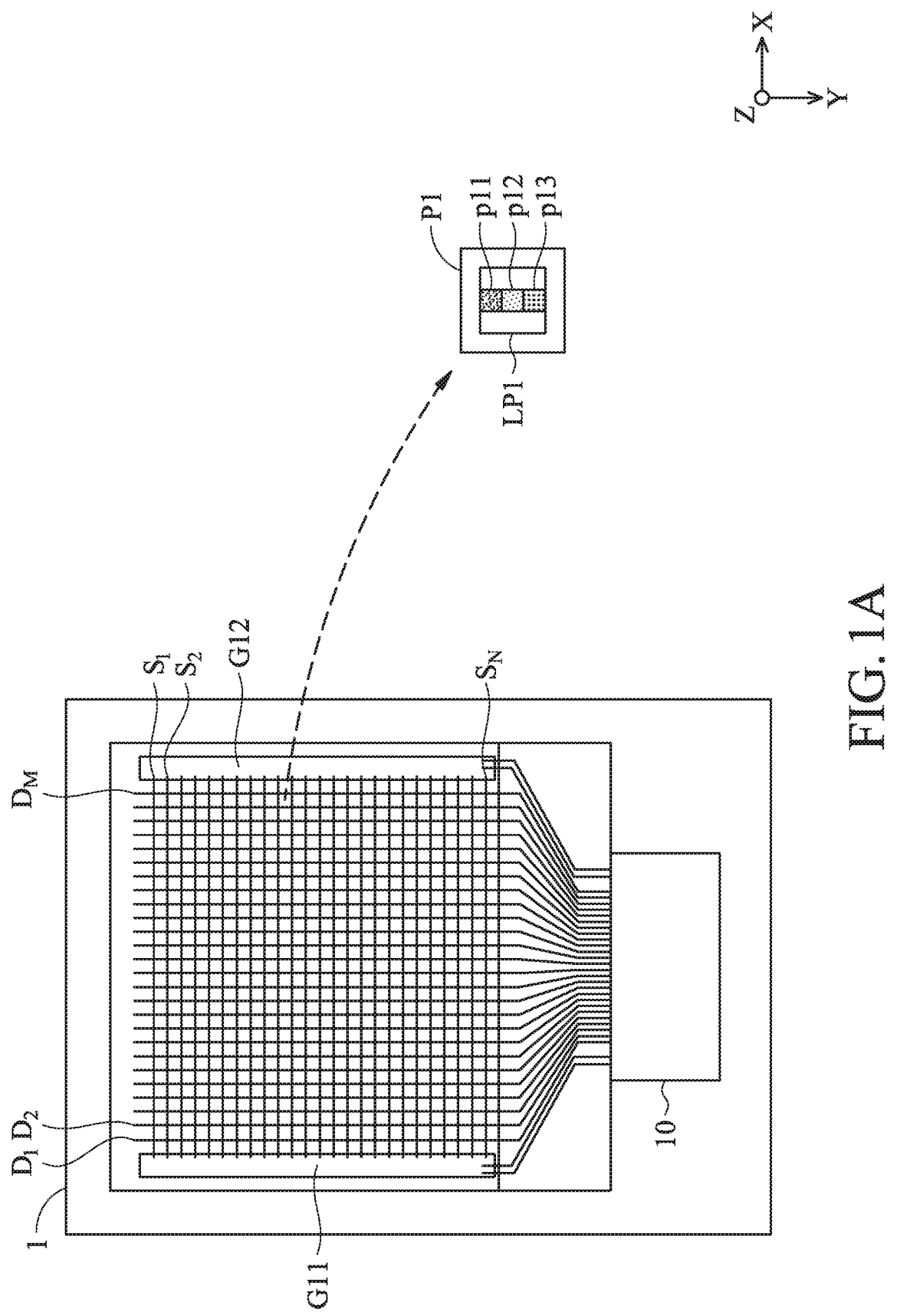
FIG. 1A is a schematic diagram of a light-emitting diode electronic device.
Figure 1B:
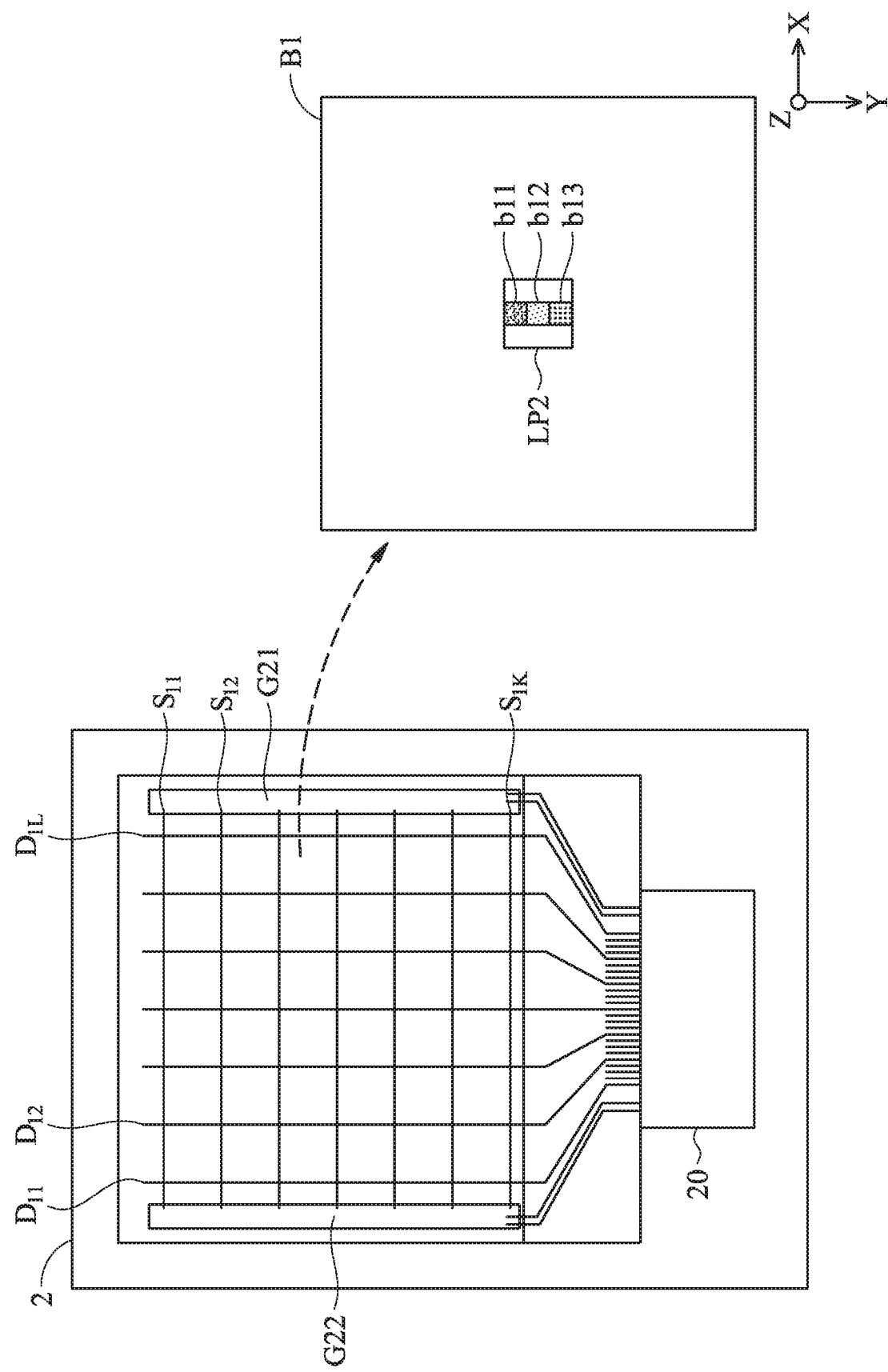
FIG. 1B is a schematic diagram of a light-emitting diode backlight electronic device.

An embodiment of the present disclosure can be applied to a light-emitting diode (LED) electronic device (as shown in FIG. 1A), or to a light-emitting diode backlight electronic device as a backlight (as shown in FIG. 1B), but is not limited thereto. In other embodiment, the LED could be organic LED, inorganic LED, or quantum dot LED, but is not limited thereto. In other embodiment, the LED size could be mini-LED (mini-meter sized) or micro-LED (micro-meter sized), but is not limited thereto. In other embodiment, the electronic device could be display device, sensing device, tiled display device, or tiled sensing device, but is not limited thereto. As shown in FIG. 1A, a light-emitting diode electronic device 1 may include a plurality of pixels, a plurality of signal lines (including a plurality of scan lines $S_1, S_2, \ldots, S_N$ and a plurality of data line $D_1, D_2, \ldots, D_M$), a gate driving circuit G11, a gate driving circuit G12, and a control chip 10 (IC). Each pixel of the light-emitting diode electronic device 1 may include at least one light-emitting diode (LED). For example, as shown on the right side of FIG. 1A, a pixel P1 of the light-emitting diode electronic device 1 may include 3 sub-pixels P11, P12 and P13, and the sub-pixels P11, P12 and P13 may be included in a LED packet LP1. The sub-pixels P11, P12 and P13 may include light-emitting diodes of different colors (combination of red, green, blue, or white) or the same color (such as red, green, blue, or white). In other embodiment, LED could be Ultraviolet LED. In some embodiments, if the sub-pixels P11, P12 and P13 include light-emitting diodes of the same color, a color conversion layer may be disposed to form three colors of red, green and blue in the light emitting direction of the same color light-emitting diode, wherein the color conversion layer may be a color photoresist or a quantum dot conversion layer. The above is an example, and the present disclosure is not limited thereto. The structure of the light-emitting diode may be a vertical structure or a horizontal structure of the light-emitting diode. For example, if the light-emitting diode has the vertical structure, two electrodes of the light-emitting diode disposed at opposite sides and at least partially overlap from a top view (the Z direction) of the light-emitting diode electronic device. By contrast, if the light-emitting diode has the horizontal structure, the two electrodes of the light-emitting diode disposed at the same side and do not overlap. The above-mentioned pixel design and the structure of the light-emitting diode can also be applied to the subsequent LED backlight electronic device, and will not be described again. As shown in FIG. 1B, a light-emitting diode backlight electronic device 2 may include a plurality of back light units (BLUs), a plurality of signal lines (including a plurality of scan lines $S_{11}$, $S_{12}$, ..., $S_{1K}$ and a plurality of data line $D_{11}$, $D_{12}$, ..., $D_{1L}$), a gate driving circuit G21, a gate driving circuit G22, and a control chip 20. Each backlight unit of the light-emitting diode backlight electronic device 2 may at least include a light-emitting diode. As shown on the right side of FIG. 1B, a backlight unit B1 of the light-emitting diode backlight electronic device 2 may include 3 sub-pixels b11, b12 and b13, and the sub-pixels b11, b12 and b13 may be included in a LED packet LP2, but is not limited thereto. In another embodiment, the backlight unit B1 may include a single sub-pixel, the color of the sub-pixel can be white or other suitable color for the light-emitting diode backlight electronic device 2. In addition, as shown in FIG. 1A and FIG. 1B, since the density of the LEDs disposed in the LED device is relatively high, the LED device can have a higher resolution than the LED backlight device. In some embodiments, from the top view along a Z axis, the pixel P1 of the LED device 1 has a cross-sectional area of about 1.5 mm*1.5 mm, and the backlight unit B1 of the LED backlight device 2 has a cross-sectional area of about 5 mm*5 mm. The above is an example, and the present disclosure is not limited thereto. Specifically, in order to simplify the explanation, an electronic device 100 is exemplified by a LED backlight electronic device, but the present disclosure is not limited thereto. Control chips, data lines, or scan lines disclosed in the following embodiments can also be applied to the LED device.

Figure 2A:
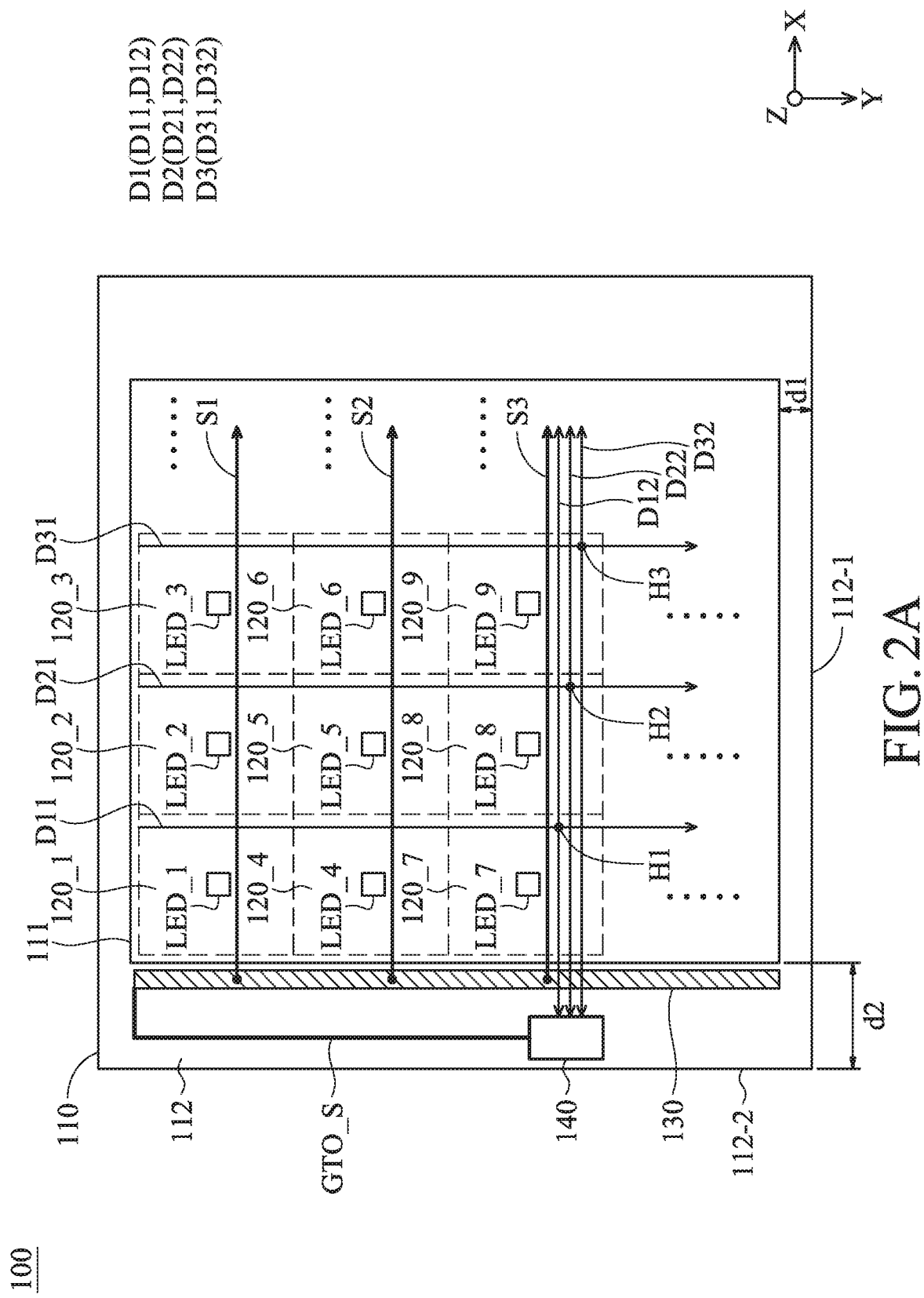
FIG. 2A is a schematic diagram of an electronic device 100 in accordance with an embodiment of the disclosure.

Specially, the "section" described in embodiments of the present disclosure means a portion of a signal line corresponding to different extension directions. For example, as shown in FIG. 2A, the data line D1 may include a data line section D11 extended in a Y direction and a data line section D12 extended in an X direction, but the present disclosure is not limited thereto. In addition, the length of the "section" in embodiments of the present disclosure can be adjusted according to the size of different electronic devices. In some embodiments of the present disclosure, the lengths of the section extended in the same direction may be the same. In some embodiments of the present disclosure, the lengths of the sections that extend in different directions may be the same or different.

FIG. 2A is a schematic diagram of an electronic device 100 in accordance with an embodiment of the disclosure. The electronic device 100 may be an LED backlight electronic device. As shown in FIG. 2A, the electronic device 100 may include a substrate 110, a plurality of backlight unit 120_1~120_9, a plurality of data lines D1 (including the data line section D11 and a data line section D12), D2 (including a data line section D21 and a data line section D22), and D3 (including a data line section D31 and a data line section D32), a plurality of scan lines S1~S3, a gate driving circuit (gate on panel, GOP or scan line driving circuit) 130, and a control chip 140. The control chip 140 may be a timing controller (Tcon) or other suitable control chips. In some embodiments, the substrate 110 may include a non-flexible substrate or a flexible substrate. For example, the non-flexible substrate may include a glass substrate, a sapphire substrate, or other suitable substrate. The flexible substrate may include a ceramic substrate, a plastic substrate, or other suitable substrate. The material of the plastic substrate may be polyimide (PI), polyethylene terephthalate (PET), polycarbonate (PC), polyethersulfone (PES), polybutylene terephthalate (PBT), polyethylene naphthalate (PEN), polyarylate (PAR), other suitable materials, or combinations thereof, but the present disclosure is not limited thereto. In some embodiments, as shown in FIG. 2A, each backlight units 120_1~120_9 may include light-emitting diodes LED_1~LED_9. In some embodiments, the LEDs LED_1~LED_9 may be, for example, an organic light-emitting diode or a inorganic light-emitting diode, such as a quantum dot line emitting diode (Q-LED), a micro LED, or a mini LED, but the present disclosure is not limited thereto. In particular, the schematic diagram shown in FIG. 2A is for convenience of explaining the embodiment of the disclosure. The number of backlight units, scan lines, data lines, or other lines in FIG. 2A is shown in partial, but the present disclosure is not limited thereto. Other components may also be included in the electronic device 100.

As shown in FIG. 2A, the substrate 110 has a display area 111 and a non-display area 112, wherein the non-display area 112 is disposed adjacent to (around) the circumference of the display area 111. The backlight units 120_1~120_9, the data lines D1~D3, and the scan line S1~S3 may be disposed in the display area 111. In addition, in some embodiments, a minimum length d1 between an outer edge 112-1 of the non-display area 112 corresponding to a first extension direction (for example, the Y direction) and the display area 111 is less than a minimum length d2 between the other outer edge 112-2 of the non-display area 112 corresponding to a second extension direction (for example, the X direction) and the display area 111, but the present disclosure is not limited thereto. In other words, in the embodiment above, the non-display area 112 has a larger space available on the border area of the left and right sides (non-splicing sides), and the border area of the respective non-display areas 112 of the two adjacent electronic devices 100 on the upper and lower sides (splicing sides) can be further reduced. However, in another embodiment of the disclosure, the non-display area 112 can also have a large space available on the border area of the upper and lower sides. In the embodiment of the present disclosure, the control chip 140 is disposed at a position where the border area of the non-display area 112 has a larger space. That is, in embodiments of the present disclosure, regardless of whether the electronic device 100 is a landscape electronic device or a portrait electronic device, the control chip 140 may be disposed at a position where the border area of the non-display area 112 has a larger space according to the spatial configuration of the non-display area 112 of the electronic device 100, so that the two adjacent electronic devices 100 may have better splicing effects, but the disclosure is not limited thereto.

According to an embodiment of the disclosure, when the non-display area 112 has a larger space in the border area on the left and right sides, the control chip 140 is disposed on one of the left or right sides of the non-display area 112. In addition, in the embodiment, the control chip 140 can be disposed above, in the middle, or below one of the left or right sides of the border area of the non-display area 112 according to the configuration of the power distribution or the limitation between the mechanisms (for example, the interference between the control chip 140 and the flexible print circuit (FPC)), but the disclosure is not limited thereto.

According to another embodiment of the disclosure, when the non-display area 112 has a larger space in the border area on the upper and downer sides, the control chip 140 is disposed on one of the upper and downer sides of the non-display area 112. In addition, in the embodiment, the control chip 140 can be disposed on the right, in the middle, or on the left of one of the upper and downer sides of the border area of the non-display area 112 according to the configuration of the power distribution or the limitation between the mechanisms (for example, the interference between the control chip 140 and the flexible print circuit (FPC)), but the disclosure is not limited thereto.

According to an embodiment of the disclosure, the control chip 140 may be mounted by a chip on film (COF) method or a chip on glass (COG) method, but the disclosure is not limited thereto. The control chip 140 can be used to control or transfer different signals to the data lines D1~D3 and the scan lines S1~S3, respectively.

According an embodiment of the disclosure, the data line D1 may include the data line section D11 and the data line section D12, the data line D2 may include the data line section D21 and the data line section D22, and the data line D3 may include the data line section D31 and the data line section D32. As shown in FIG. 2A, the data line section D12, the data line section D22 and the data line section D33 electrically connect to the control chip 140 respectively, and a signal line GTO_S of the gate driving circuit 130 also electrically connects to the control chip 140. In addition, the scan lines S1~S3 electrically connect to the gate driving circuit 130 respectively.

In addition, as shown in FIG. 2A, from a top view direction (Z direction) of the electronic device 100, the data line section D11 is crossed with the data line section D12, the data line section D22 and the data line section D32 respectively. The data line section D21 is crossed with the data line section D12, the data line section D22 and the data line section D32 respectively. The data line section D31 is crossed with the data line section D12, the data line section D22 and the data line section D32 respectively. The data line section D11 of the data line D1, the data line section D21 of the data line D2, and the data line section D31 of the data line D3 extend substantially in the Y direction, and are sequentially arranged in the X direction. The data line section D11, the data line section D21, and the data line section D31 may have a wavy shape, a bent shape, a mesh shape, or other suitable shape, but still extend substantially in the Y direction. In addition, the data line section D12 of the data line D1, the data line section D22 of the data line D2, and the data line section D32 of the data line D3 extend substantially in the X direction, and are sequentially arranged in the Y direction. The data line section D12, the data line section D22, and the data line section D32 may have a wavy shape, a bent shape, a mesh shape, or other suitable shape, but still extend substantially in the X direction.

The scan lines S1~S3 extend substantially in the X direction, and are sequentially arranged in the Y direction. The scan lines S1~S3 may have a wavy shape, a bent shape, a mesh shape, or other suitable shape, but still extend substantially in the X direction. The scan lines S1~S3 are crossed with the data line section D11, the data line section D21, and the data line section D31.

Figure 2B:
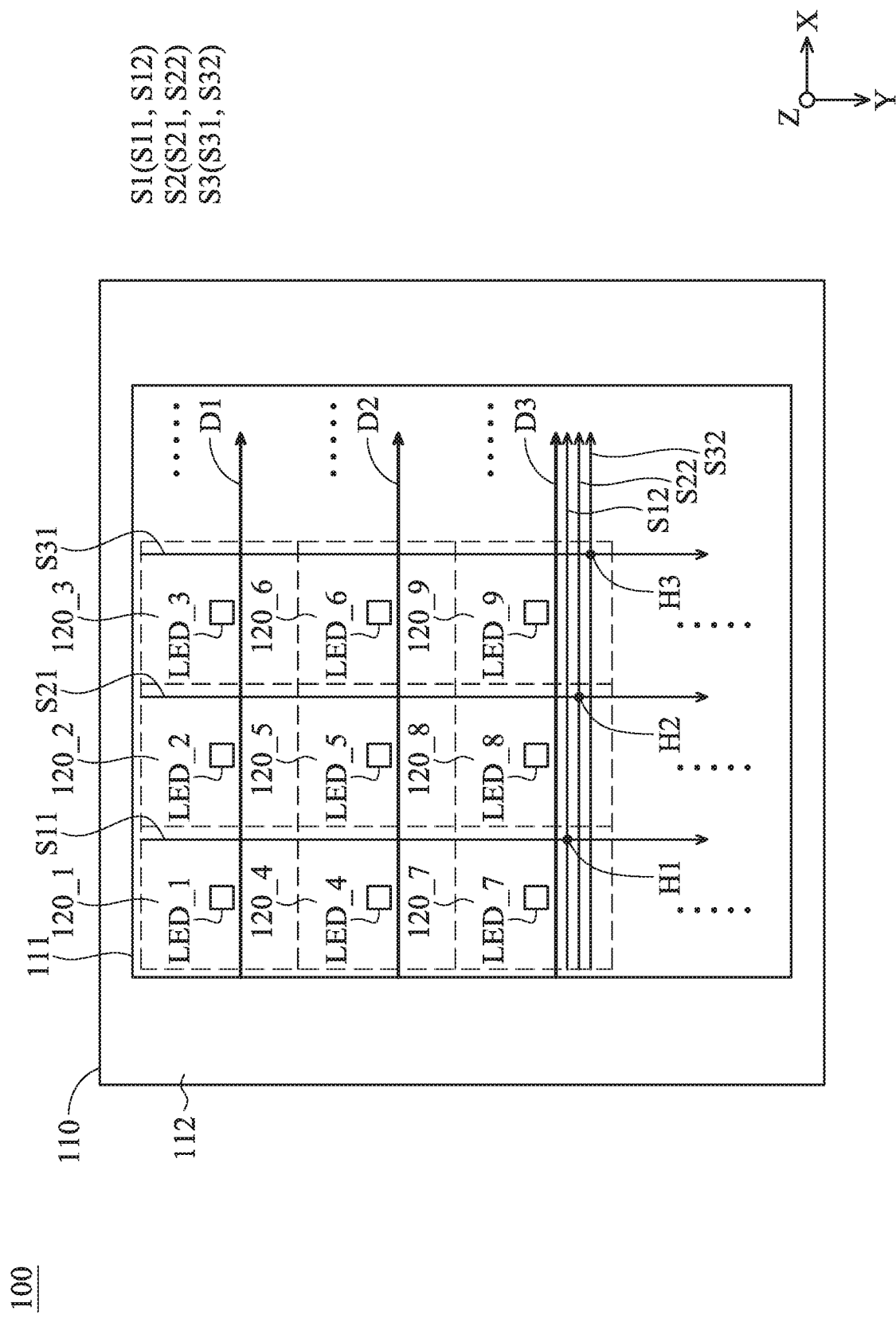
FIG. 2B is a schematic diagram of the electronic device 100 in accordance with another embodiment of the disclosure.

FIG. 2B is a schematic diagram of the electronic device 100 in accordance with another embodiment of the disclosure. As shown in FIG. 2B, in another embodiment, the data lines D1~D3 can also be exchanged with the scan lines S1~S3. That is, as shown in FIG. 2B, the scan line S1 may include scan line sections S11 and S12, the scan line S2 may include scan line sections S21 and S22, and the scan line S3 may include scan line sections S31 and S32. From a top view direction (Z direction) of the electronic device 200, the scan line section S11 is crossed with the scan line section S12, the scan line section S22, and the scan line section S32, respectively. The scan line section S21 is crossed with the scan line section S12, the scan line section S22, and the scan line section S32, respectively. The scan line section S31 is crossed with the scan line section S12, the scan line section S22, and the scan line section S32, respectively. The scan line section S11 of the scan line S1, the data line section S21 of the scan line S2, and the scan line section S31 of the scan line S3 extend substantially in the Y direction, and are sequentially arranged in the X direction. The scan line section S11, the scan line section S21, and the scan line section S31 have a wavy shape, a bent shape, a mesh shape, or other suitable shape, but still extend substantially in the Y direction. In addition, the scan line section S12 of the scan line S1, the data line section S22 of the scan line S2, and the scan line section S32 of the scan line S3 extend substantially in the X direction, and are sequentially arranged in the Y direction. The scan line section S12, the scan line section S22, and the scan line section S32 have a wavy shape, a bent shape, a mesh shape, or other suitable shape, but still extend substantially in the X direction. In addition, the data lines D1~D3 extend substantially in the X direction, and are sequentially arranged in the Y direction. The data lines D1~D3 have a wavy shape, a bent shape, a mesh shape, or other suitable shape, but still extend substantially in the X direction. The data lines D1~D3 are crossed with the scan line section S11, the scan line section S21, and the scan line section S31. It is noted that since the arrangement of the gate driving circuit 130 and the control chip 140 is similar to that shown in FIG. 2A, thus it will not be repeated here in FIG. 2B.

Figure 3:
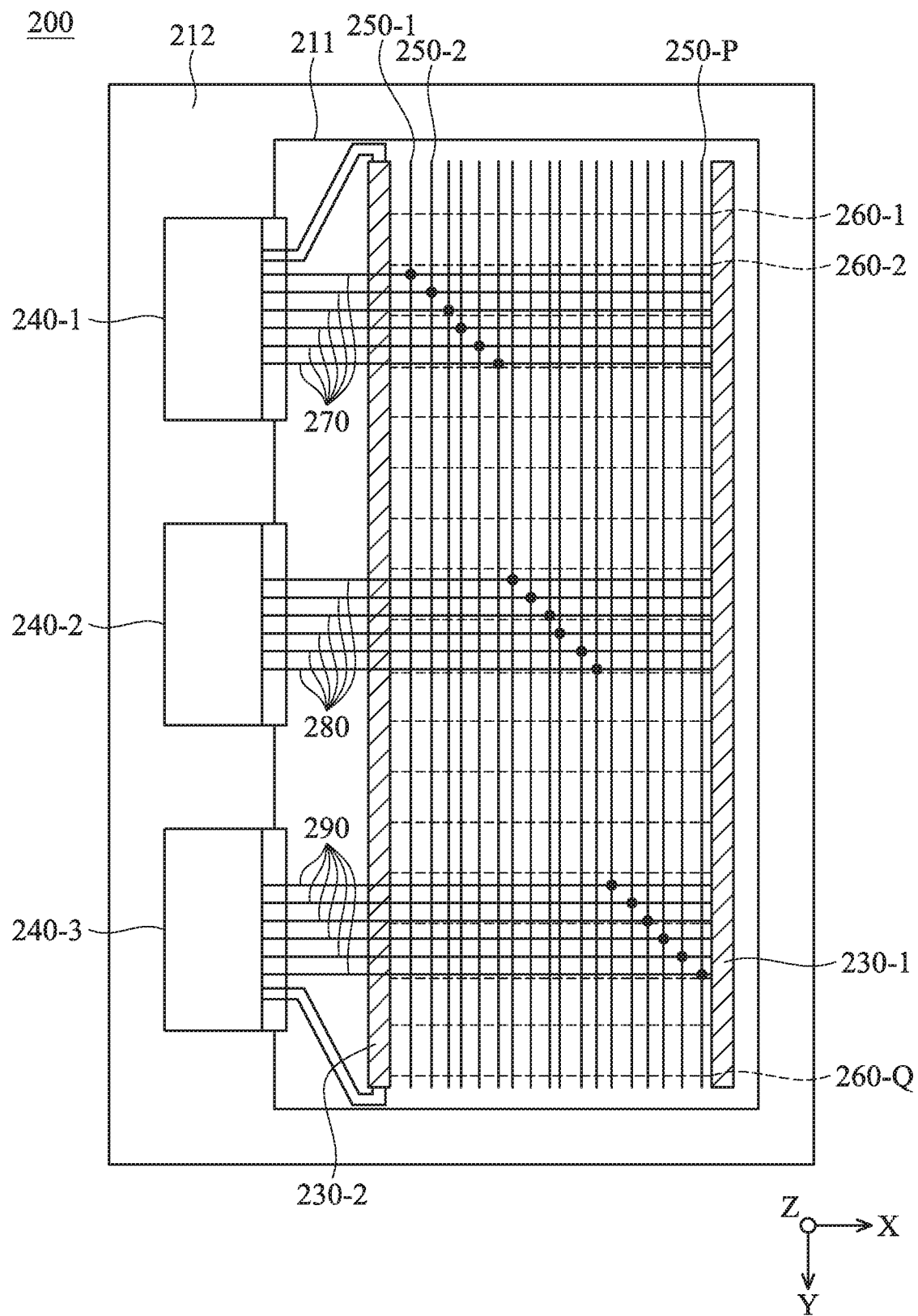
FIG. 3 is a schematic diagram of an electronic device 200 in accordance with the embodiment of the disclosure.

According to an embodiment of the disclosure, a plurality of control chips may also be disposed in an electronic device, which will be described below with reference to FIG. 3. FIG. 3 is a schematic diagram of an electronic device 200 in accordance with the embodiment of the disclosure. As shown in FIG. 3, the electronic device 200 may include a display area 211, a non-display area 212, two gate driving circuits 230-1 and 230-2, a control chip 240-1, a control chip 240-2, a control chip 240-3, a plurality of data line sections 250-1, 250-2, . . . , 250-P extended in the Y direction, a plurality of data line sections 270, 280, and 290, and a plurality of scan lines 260-1, 260-2, . . . , 260-Q. As shown in FIG. 3, in the embodiment, each data line may include two sections. The control chip 240-1 may control the plurality of data line sections 270, the control chip 240-2 may control the plurality of data line sections 280, and the control chip 240-3 may control the plurality of data line sections 290. In addition, in the embodiment, the control chips 240-1, 240-2 and 240-3 are also disposed at positions having a larger space in the border area of the non-display area 212 of the electronic device 200. It is noted that the schematic diagram shown in FIG. 3 is for convenience of explaining the embodiment of the disclosure, but the disclosure is no limited thereto. In addition, other methods for configuring the signal line sections disclosed in the embodiments of the present disclosure may also be applied in this embodiment. In addition, FIG. 3 is mainly used to illustrate an embodiment with a plurality of control chips. Therefore, other components of the electronic device 200 can be referred to FIG. 2A, and will not be described in FIG. 3 again. In addition, there are different intervals between the data line sections 250-1, 250-2, . . . , 250-P shown in FIG. 3, but the disclosure is not limited thereto. In other embodiments, the interval between the data line sections 250-1, 250-2, . . . , 250-P may also be substantially the same.

Figure 4:
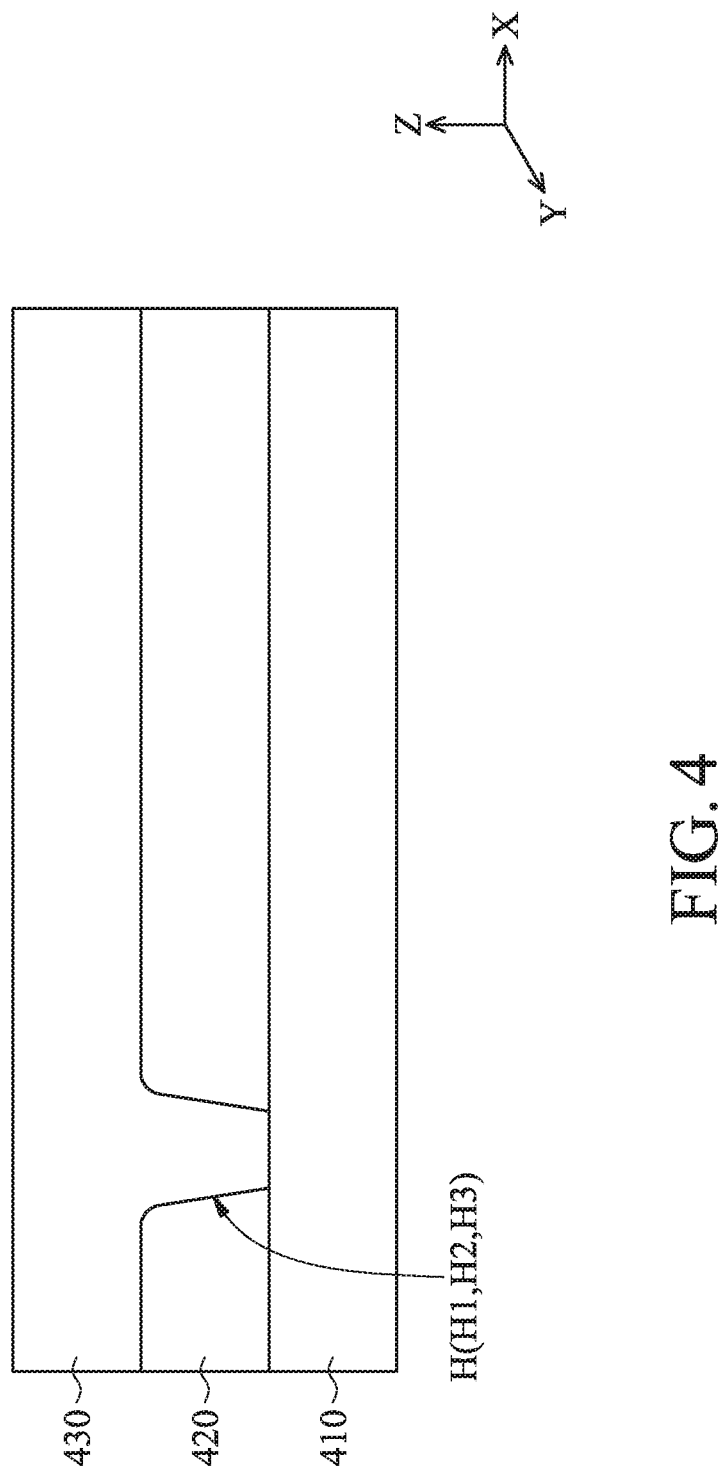
FIG. 4 is a partial cross-sectional view of the electronic device 100 in accordance with the embodiment of the disclosure.

FIG. 4 is a partial cross-sectional view of the electronic device 100 in accordance with the embodiment of the disclosure. It is noted that the cross-sectional view shown in FIG. 4 is for explaining the embodiment of the disclosure, but the disclosure is not limited thereto. The structure of the other layers will also be included in the cross-sectional view of the electronic device 100. According to an embodiment of the disclosure, as shown in FIG. 4, a first metal layer 410 is disposed in the electronic device 100. The first metal layer 410 is patterned (for example, via lithography, etching, etc., but the disclosure is not limited thereto) to form a data line section sequentially disposed in the Y direction (such as the data line section D11 of the data line D1, the data line section D21 of the data line D2, and the data line section D31 of the data line D3), but the disclosure is not limited thereto. Then, an insulation layer is disposed on the first metal layer 410. An insulation layer 420 may be composed of silicon oxide (SiOx), silicon nitride (SiNx), or a combination of silicon oxide (SiOx) and silicon nitride (SiNx), but the disclosure is not limited thereto. Then, a plurality of through hole H (for example, H1, H2, and H3 shown in FIG. 2A) are formed in the insulation layer 420 through a patterning process, and a second metal layer 430 is deposited on the insulation layer 420, so that the first metal layer 410 may be in contact with the second metal layer 430 by filling the second metal layer 430 into the through holes. The second metal layer 430 is patterned (for example, via lithography, etching, etc., but the disclosure is not limited thereto) to form a data line section sequentially disposed in the X direction (such as the data line section D12 of the data line D1, the data line section D22 of the data line D2, and the data line section D32 of the data line D3), but the disclosure is not limited thereto. The data line section of the first metal layer 410 electrically connects to the data line section of the second metal layer 430 via the through holes. For example, the data line section D11 of the data line D1 may electrically connect to the data line section D12 of the data line D1 via the through hole 111, the data line section D21 of the data line D2 may electrically connect to the data line section D22 of the data line D2 via the through hole 112, and the data line section D31 of the data line D3 may electrically connect to the data line section D32 of the data line D3 via the through hole H3. Therefore, the signal of the data line section D11 can be transmitted to the data line section D12, the signal of the data line section D21 can be transmitted to the data line section D22, and the signal of the data line section D31 can be transmitted to the data line section D32. In this embodiment, the first metal layer 410 and the second metal layer 430 may comprises conductive materials, such as metals, alloys, metal oxides, metal oxynitrides, or other suitable materials. In addition, in some embodiments, the first metal layer 410 or the second metal layer 430 may be a conductive layer with at least two layers or more. For example, in the cross-sectional direction (Z direction), if the first metal layer 410 or the second metal layer 430 has a three-layer structure, the material for use may be molybdenum/aluminum/molybdenum or titanium/copper/titanium from bottom to top. In some embodiments, the first metal layer 410 and the second metal layer 430 may be a single layer of conductive layers.

Figure 5A:
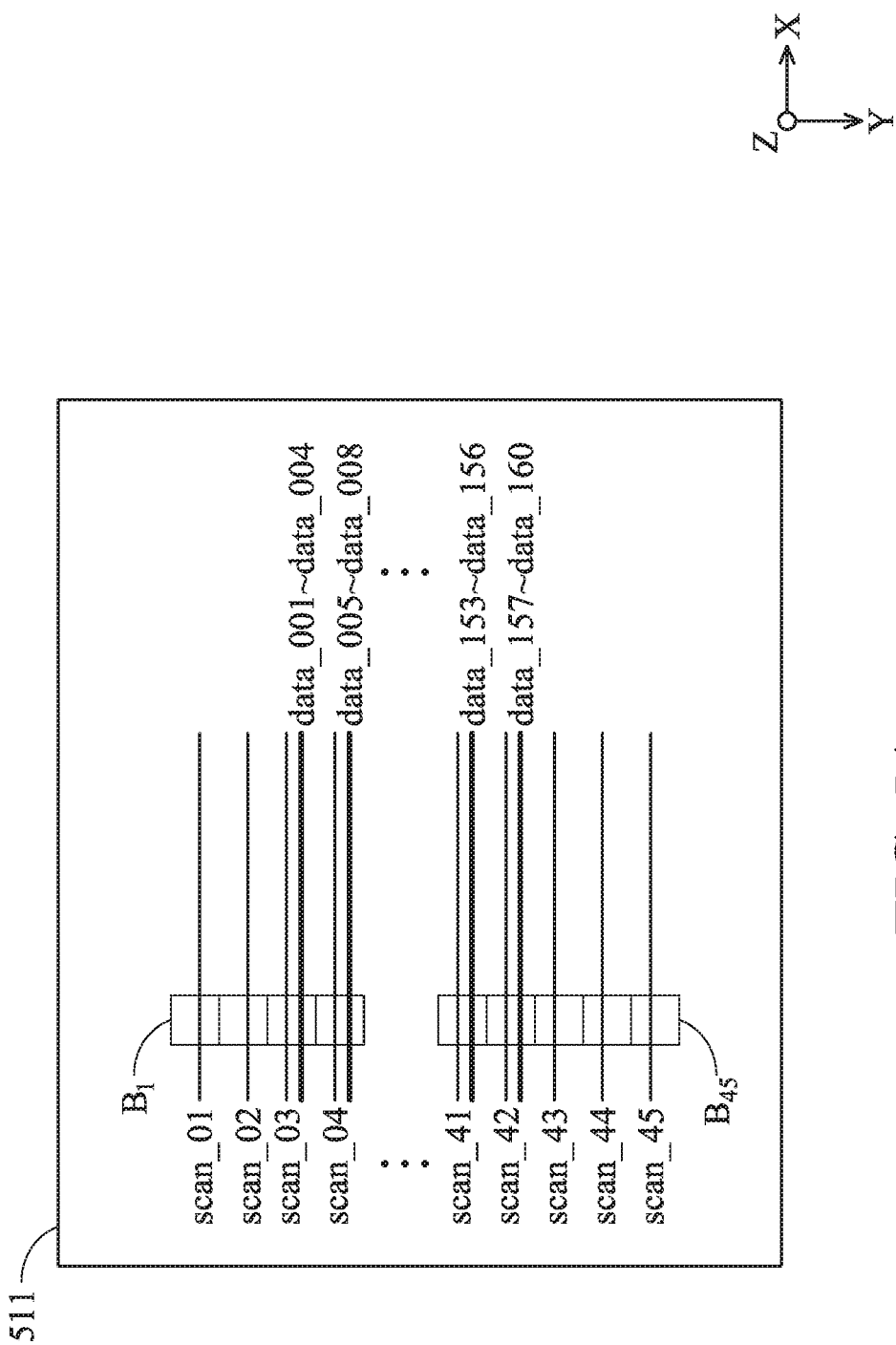
FIG. 5A is a schematic diagram of a data line section disposed between scan lines in accordance with the embodiment of the disclosure.
Figure 5B:
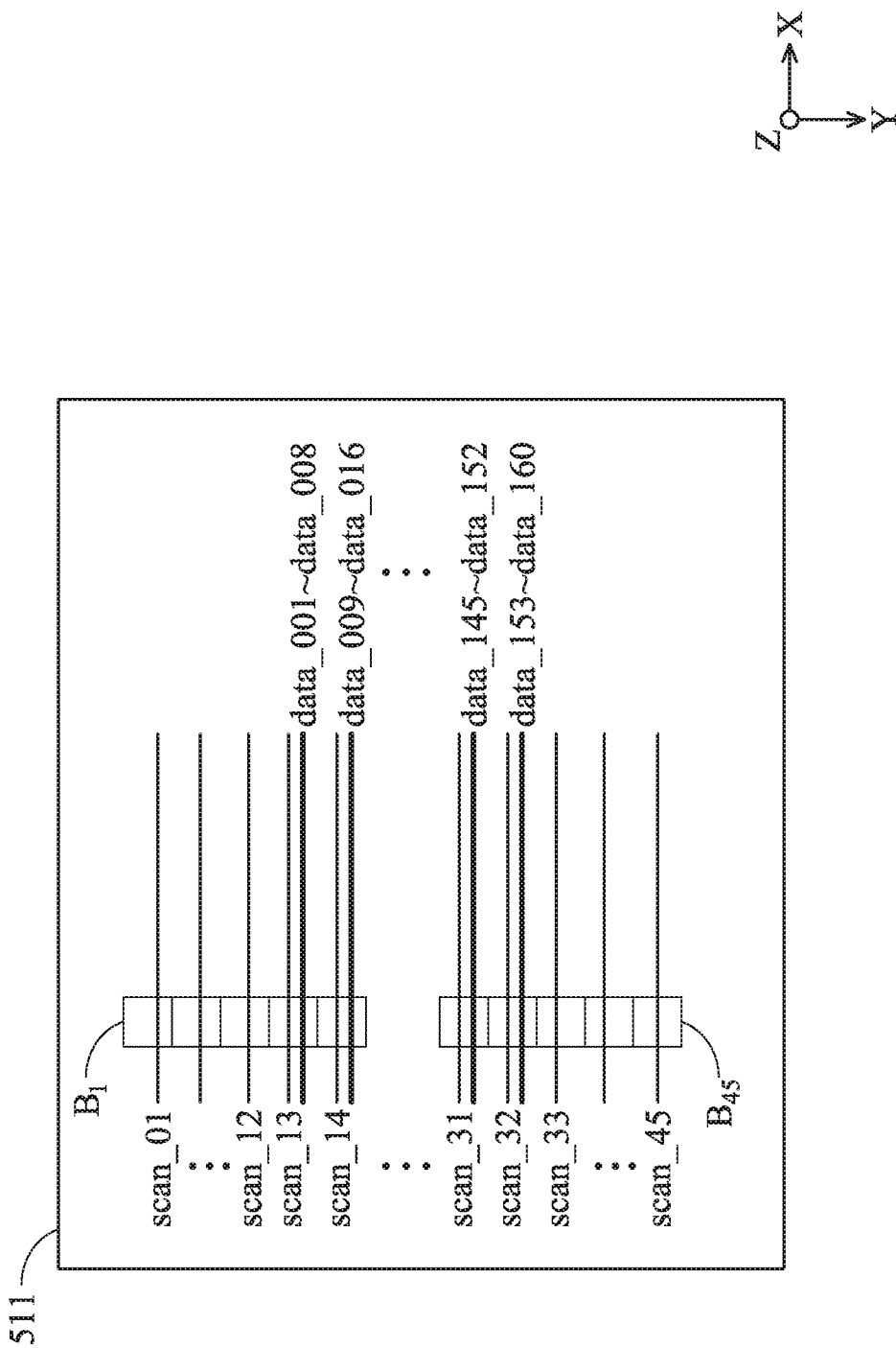
FIG. 5B is a schematic diagram of a data line section disposed between scan lines in accordance with the embodiment of the disclosure.
Figure 5C:
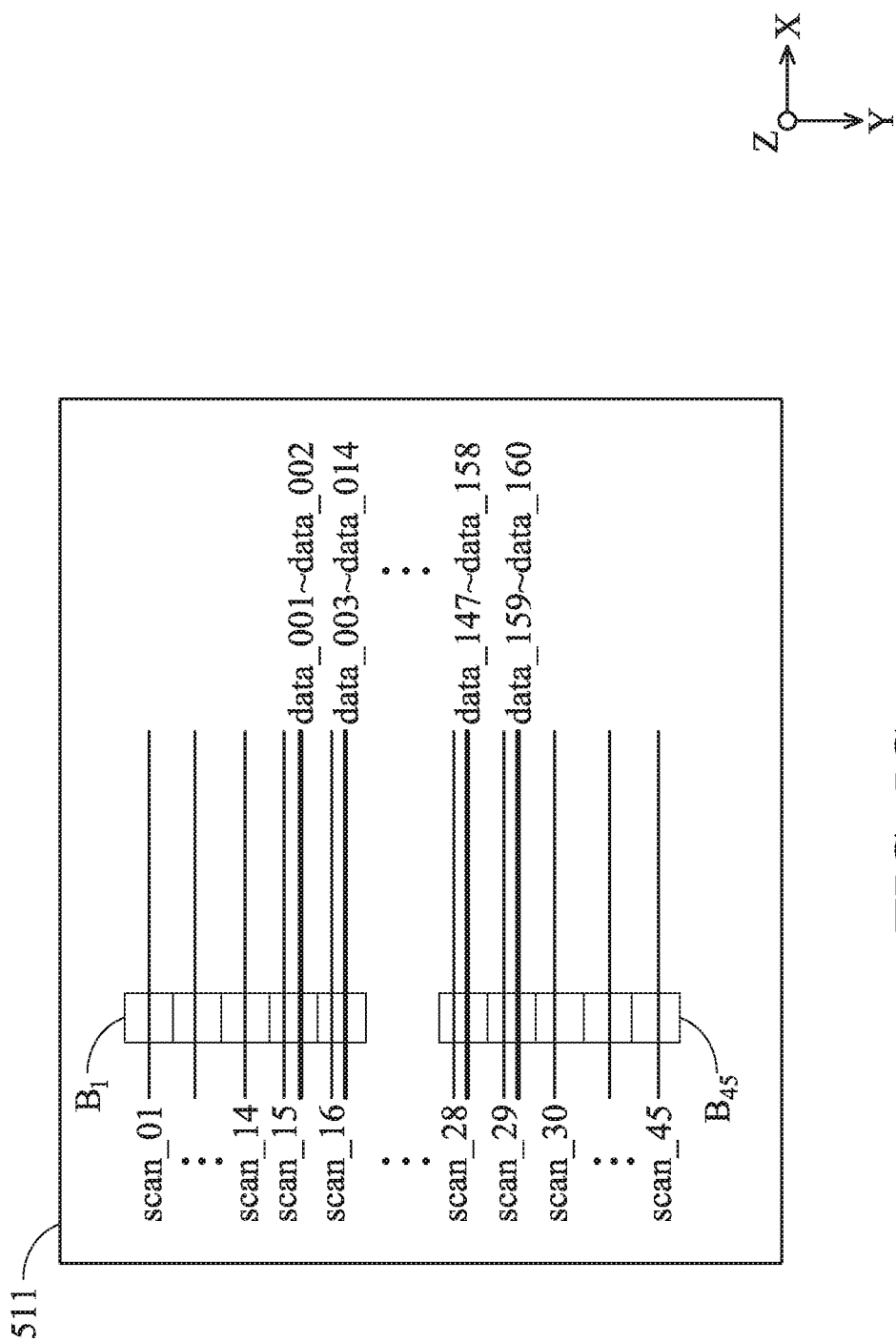
FIG. 5C is a schematic diagram of a data line section disposed between scan lines in accordance with the embodiment of the disclosure.

According to an embodiment of the disclosure, the data line sections sequentially arranged in the Y direction (for example, the data line section D12 of the data line D1, the data line section D22 of the data line D2, and the data line section D32 of the data line D3) may be evenly arranged in the interval between scan lines. According to another embodiment of the disclosure, the data line sections sequentially arranged in the Y direction (for example, the data line section D12 of the data line D1, the data line section D22 of the data line D2, and the data line section D32 of the data line D3) may be randomly arranged in the interval between scan lines. The following paragraphs will be illustrated by FIGS. 5A-5C. It should be noted that the method of configuring the data line segment shown in the FIGS. 5A-5C is for explaining some embodiments of the present disclosure, but the disclosure is not limited thereto. In some embodiments, the method of configuring the data line section may be adjusted according to the position of the control chip 140, or according to the requirements of different manufacturing, to reduce the border edge generated by the splicing of the respective non-display areas 112 of the two adjacent electronic devices 100.

FIG. 5A is a schematic diagram of a data line section disposed between scan lines in accordance with the embodiment of the disclosure. As shown in FIG. 5A, if a display area 511 of an electronic device has backlight units $B_1$~$B_{45}$, 45 scan lines scan_01~scan_45, and 160 data line sections data_001~data_160. That is, the scan lines scan_01~scan_45 have 44 intervals (space separations) for configuring 160 data line sections data_001~data_160. If it is decided to set the data line sections data_001~data_160 in the middle, and dispose 4 data line sections in one interval, as shown in FIG. 5A, the 160 data line sections data_001~data_160 can be equally arranged on the interval between the scan lines scan_03~scan_43 by every 4 data line sections, but the disclosure is not limited thereto. In an embodiment, setting in the middle means that the control chip 140 is disposed in a region of the non-display area 112 of the electronic device 100 and in a position of about one half of the Y direction.

FIG. 5B is a schematic diagram of a data line section disposed between scan lines in accordance with another embodiment of the disclosure. As shown in FIG. 5B, if a display area 511 of an electronic device has backlight units $B_1$~$B_{45}$, 45 scan lines scan_01~scan_45, and 160 data line sections data_001~data_160. That is, the scan lines scan_01~scan_45 have 44 intervals (space separation) for configuring 160 data line sections data_001~data_160. If it is decided to set the data line sections data_001~data_160 in the middle, and configure 8 data line sections in one interval, as shown in FIG. 5B, the 160 data line sections data_001~data_160 can be equally arranged on the interval between the scan lines scan_13~scan_33 by every 8 data line sections, but the disclosure is not limited thereto.

FIG. 5C is a schematic diagram of a data line section disposed between scan lines in accordance with another embodiment of the disclosure. As shown in FIG. 5C, if a display area 511 of an electronic device has backlight units $B_1 \sim B_{45}$, 45 scan lines scan_01~scan_45, and 160 data line sections data_001~data_160. That is, the scan lines scan_01~scan_45 have 44 intervals (space separation) for configuring 160 data line sections data_001~data_160. If it is decided to set the data line sections data_001~data_160 in the middle, and configure 12 data line sections in one interval, as shown in FIG. 5C, the data line sections data_001~data_002 can be configured in the scan lines scan_15~scan_16, and the scan lines scan_15~scan_16 can be configured in the scan lines scan_29~scan_30. The remaining data line sections can be evenly arranged in the interval among the scan lines scan_16~scan_29 by every 12 data line sections, but the disclosure is not limited thereto.

It is noted that, in the embodiments of the present disclosure described above, the data line is disposed in the interval of the scan lines as an example, but the disclosure is not limited thereto. That is, in other embodiments of the disclosure, each scan line may also include two scan line sections, and the scan line sections may also be disposed in the interval of the data lines.

According to some embodiments of the present disclosure, the control chip of the electronic device can be disposed at a position where the non-display area has a larger space. In addition, according to some embodiments of the present disclosure, the data line or the scan line can be configured in two sections according to the configuration requirements, and the section connecting the control chips can be disposed in the interval of the data line or the scan line. Therefore, according to some embodiments of the present disclosure, the space of the border area of the non-display area of the electronic device can be effectively used, and/or the area occupied by the trace of the signal line can also be reduced.

The "an embodiment" or "some embodiments" referred to in the specification means that the specific features, structures, or characteristics described in connection with embodiments are included in at least one embodiment of the disclosure, but does not mean that they are present in every embodiment. Therefore, the phrase "in an embodiment" or "in some embodiments", which is used in the specification, does not necessarily mean the same embodiment of the disclosure.

The ordinals in the specification and the claims of the present disclosure, such as "first", "second", "third", etc., has no sequential relationship, and is just for distinguishing between two different devices with the same name. In the specification of the present disclosure, the word "couple" refers to any kind of direct or indirect electronic connection. The present disclosure is disclosed in the preferred embodiments as described above, however, the breadth and scope of the present disclosure should not be limited by any of the embodiments described above. Persons skilled in the art can make small changes and retouches without departing from the spirit and scope of the disclosure. The scope of the disclosure should be defined in accordance with the following claims and their equivalents.

What is claimed is:

1. An electronic device, comprising:
a display area;
a non-display area adjacent to the display area;
a plurality of first signal lines, and each of the plurality of first signal lines comprising:
a first section extending in a first direction; and
a second section extending in a second direction different from the first direction; wherein from a top view of the electronic device, the second section crosses the first section;
a plurality of second signal lines extending in the second direction and sequentially arranged in the first direction;
wherein the plurality of first signal lines are scan lines and the plurality of second signal lines are data lines, or the plurality of first signal lines are data lines and the plurality of second signal lines are scan lines; and
wherein each of the second sections of the plurality of first signal lines is disposed between any two of the plurality of second signal lines, and all of the second sections of the plurality of first signal lines are disposed between part of the plurality of second signal lines.

2. The electronic device as claimed in claim 1, wherein a first minimum length between an outer edge of the non-display area and the display area is less than a second minimum length between the other outer edge of the non-display area and the display area; wherein a first extension direction of the outer edge is parallel to the second direction, and a second extension direction of the other outer edge is parallel to the first direction.

3. The electronic device as claimed in claim 2, further comprising a control chip electrically connected to the second sections of the plurality of first signal lines.

4. The electronic device as claimed in claim 3, wherein the control chip is adjacent to the other outer edge and is arranged in the non-display area.

5. The electronic device as claimed in claim 1, further comprising a first metal layer, a second metal layer, and an insulation layer disposed between the first metal layer and the second metal layer, wherein the first sections of the plurality of first signal lines are included in the first metal layer, and the second sections of the plurality of first signal lines are included in the second metal layer.

6. The electronic device as claimed in claim 5, wherein the insulation layer comprises a plurality of through holes, and the first sections electrically connects to the second sections via the plurality of through holes.

7. The electronic device as claimed in claim 1, wherein the electronic device is a landscape electronic device or a portrait electronic device.

8. The electronic device as claimed in claim 3, wherein the control chip is disposed at a position where the non-display area has a larger space.

9. The electronic device as claimed in claim 3, wherein the control chip is a timing controller (Tcon).

10. The electronic device as claimed in claim 3, wherein the control chip is mounted by a chip on film (COF) method or a chip on glass (COG) method.

11. The electronic device as claimed in claim 3, wherein the control chip is configured to transfer different signals to the plurality of first signal lines and the plurality of second signal lines.

12. The electronic device as claimed in claim 2, wherein a plurality of backlight units are disposed in the display area.

13. The electronic device as claimed in claim 6, wherein the second metal layer is formed on the insulation layer, the first metal layer is in contact with the second metal layer by filling the second metal layer into the plurality of through holes.

14. The electronic device as claimed in claim 5, wherein the insulation layer is made of silicon oxide (SiOx), silicon nitride (SiNx), or a combination of silicon oxide (SiOx) and silicon nitride (SiNx).

15. The electronic device as claimed in claim 5, wherein the first metal layer or the second metal layer is a conductive layer with a single layer or multiple layers.

16. The electronic device as claimed in claim 5, wherein the first metal layer or the second metal layer has a three layer structure, and the three layer structure is made of alternating layers of molybdenum, aluminum, and molybdenum, or is made of alternating layers of titanium, copper, titanium from the bottom to the top of the first metal layer or the second metal layer.

* * * * *